(12) United States Patent
Endou et al.

(10) Patent No.: US 9,294,053 B2
(45) Date of Patent: Mar. 22, 2016

(54) AMPLIFYING CIRCUIT INCLUDING ACTIVE INDUCTOR

(71) Applicant: PANASONIC CORPORATION, Osaka (JP)

(72) Inventors: Tokio Endou, Osaka (JP); Manabu Watanabe, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 20 days.

(21) Appl. No.: 14/323,114

(22) Filed: Jul. 3, 2014

(65) Prior Publication Data
US 2014/0312979 A1 Oct. 23, 2014

Related U.S. Application Data

(63) Continuation of application No. PCT/JP2013/000363, filed on Jan. 24, 2013.

(30) Foreign Application Priority Data

Feb. 6, 2012 (JP) .................................. 2012-022847

(51) Int. Cl.
*H03F 3/04* (2006.01)
*H03F 3/193* (2006.01)
(Continued)

(52) U.S. Cl.
CPC .............. *H03F 3/193* (2013.01); *H03F 1/0261* (2013.01); *H03H 11/48* (2013.01); *H03F 2200/294* (2013.01); *H03F 2200/429* (2013.01); *H03F 2200/451* (2013.01)

(58) Field of Classification Search
CPC ......................................................... H03F 3/04

USPC ........................................... 330/285, 303, 277
See application file for complete search history.

(56) References Cited

U.S. PATENT DOCUMENTS 5,264,806 A * 11/1993 Kobayashi ................ H03F 1/34
330/294
6,028,496 A * 2/2000 Ko .......................... H03H 11/48
330/85
(Continued)

FOREIGN PATENT DOCUMENTS

| EP | 0840299 A1 | 5/1998 |
|---|---|---|
| JP | 10-145149 A | 5/1998 |
| JP | 2011-097638 A | 5/2011 |

OTHER PUBLICATIONS

Chang, Win-Ming, et al.: "2.45GHz/52GHz switched dual-band CMOS LNA with 4 gain control modes", APMC2005 Proceedings, IEEE, 4 pages.

(Continued)

*Primary Examiner* — Patricia T Nguyen
(74) *Attorney, Agent, or Firm* — McDermott Will & Emery LLP (57) ABSTRACT

An amplifying circuit includes a first transistor configured to convert an input voltage signal to a current signal, a second transistor configured to convert the current signal to an output voltage signal, and a variable active inductor in which resistors and a switch are arranged between a gate and a drain of the second transistor. The amplifying circuit further includes a third transistor configured to draw a current and connected in parallel to the first transistor and a bias circuit configured to control individually a current flowing through the first transistor and a current flowing through the third transistor.

13 Claims, 6 Drawing Sheets

(51) Int. Cl.
*H03H 11/48* (2006.01)
*H03F 1/02* (2006.01)

(56) References Cited

U.S. PATENT DOCUMENTS

| | | | | |
|---|---|---|---|---|
| 2003/0184378 A1* | 10/2003 | Segawa | ................ | H03D 7/1441 330/254 |
| 2004/0066236 A1* | 4/2004 | Fujimoto | ............. | H03B 5/1841 330/302 |
| 2008/0111632 A1* | 5/2008 | Gong | ...................... | H03F 1/223 330/310 |
| 2008/0204171 A1 | 8/2008 | Abel et al. | | |
| 2011/0143685 A1* | 6/2011 | Cebi | ......................... | H03F 1/34 455/73 |
| 2012/0293265 A1* | 11/2012 | Heikkinen | .............. | H03F 1/565 330/291 |

OTHER PUBLICATIONS

International Search Report issued in PCT/JP2013/000363, dated Mar. 26, 2013, with English translation.

\* cited by examiner

AMPLIFYING CIRCUIT INCLUDING ACTIVE INDUCTOR

CROSS-REFERENCE TO RELATED APPLICATIONS

This is a continuation of International Application No. PCT/JP2013/000363 filed on Jan. 24, 2013, which claims priority to Japanese Patent Application No. 2012-022847 filed on Feb. 6, 2012. The entire disclosures of these applications are incorporated by reference herein.

BACKGROUND

The present disclosure relates to amplifying circuits including an active inductor.

Recently, various wireless communication services such as cellular telephones and wireless local area networks (LANs) have become available. In particular, attention is being given to multiband technologies which enable an apparatus to include a plurality of systems. Further, since battery-activated systems are used in the field related to the specified low power radio communication, there is an increasing demand for the systems to reduce power consumption in order to increase the lives of batteries.

Low noise amplifiers (LNAs) provided at the first stage in a large-scale integrated circuit (LSI) are key components for producing an apparatus capable of supporting multiple frequency bands. Conventionally, apparatuses capable of supporting multiple frequency bands have been produced by installing a plurality of LNAs each handling a corresponding frequency band or by installing a plurality of switchable inductors serving as LNA loads (see Win-Ming Chang et al., "2.45 GHz/5.2 GHz switched dual-band CMOS LNA with 4 gain control modes," APMC 2005 Proceedings).

However, installing a plurality of LNAs or using a plurality of inductors each made of an interconnecting wire leads to an increase in the layout area, and accordingly, to an increase in costs of the LSI.

Under these circumstances, active inductors including a metal oxide semiconductor (MOS) transistor and a resistive element have been developed. Use of the active inductor as a load of an amplifier can reduce a layout area as compared to a case where inductors made of interconnecting wires are used (see U.S. Patent Publication No. 2008/0204171).

SUMMARY

According to the technique described in U.S. Patent Publication No. 2008/0204171, an apparatus includes resistors connected in series to each other, and one resistor to be bypassed is selected by means of a corresponding switch, thereby enabling the gain of the apparatus to be changed and the apparatus to support different frequency bands. Accordingly, regardless of the selected switch, parasitic components of the resistors and the switches are added to high frequency signal lines, and the high frequency characteristics are degraded. In addition, the layout area increases if the series connected resistors are arranged in a straight line, and the high frequency characteristics are degraded if the series connected resistors are arranged in a bend line. Further, although it is possible to change the gain by changing a resistance value, a change in the gain results in a change in an inductive component, and thereby causing undesired shifting of a peak frequency.

It is therefore an object of the present disclosure to enable an amplifying circuit including an active inductor to switch between frequency bands and to control a gain while reducing degradation of high frequency characteristics.

To achieve the object, an amplifying circuit according to an aspect of the present disclosure includes: a first transistor configured to convert an input voltage signal to a current signal; and an active inductor configured to convert the current signal to an output voltage signal and to supply the output voltage signal to an output terminal, wherein the active inductor includes a second transistor provided between the output terminal and a power supply, a first resistor and a second resistor connected in parallel to each other between a gate and a drain of the second transistor, and a switch connected in series to the first resistor between the gate and the drain of the second transistor.

An amplifying circuit according to another aspect of the present disclosure includes: a first transistor configured to convert an input voltage signal to a current signal; and an active inductor configured to convert the current signal to an output voltage signal and to supply the output voltage signal to an output terminal, wherein the active inductor includes a second transistor provided between the output terminal and a power supply, and a first resistor and a first switch connected in series to each other between a gate and a drain of the second transistor, and the amplifying circuit further includes a second resistor and a second switch connected in series to each other between the drain and a source of the second transistor.

An amplifying circuit according to yet another aspect of the present disclosure includes: a first transistor configured to convert an input voltage signal to a current signal; and an active inductor configured to convert the current signal to an output voltage signal and to supply the output voltage signal to an output terminal, wherein the active inductor includes a second transistor provided between the output terminal and a power supply, and a resistor connected between a gate and a drain of the second transistor, and the amplifying circuit further includes a third transistor connected to the output terminal and being in parallel with the first transistor, and a bias circuit configured to control individually a current flowing through the first transistor and a current flowing through the third transistor.

The present disclosure enables an amplifying circuit including an active inductor to switch between frequency bands and to control a gain while reducing degradation of high frequency characteristics. Thus, the amplifying circuit of the present disclosure does not need to include amplifiers each of which handles a corresponding frequency band or inductors made of interconnecting wires, thereby reducing a chip area.

DETAILED DESCRIPTION

Embodiments of the present disclosure will be described below with reference to the drawings. Note that components having a similar function are denoted by the same reference character throughout the embodiments and variations, and description of such components are not repeated.

Embodiment 1

Figure 1:
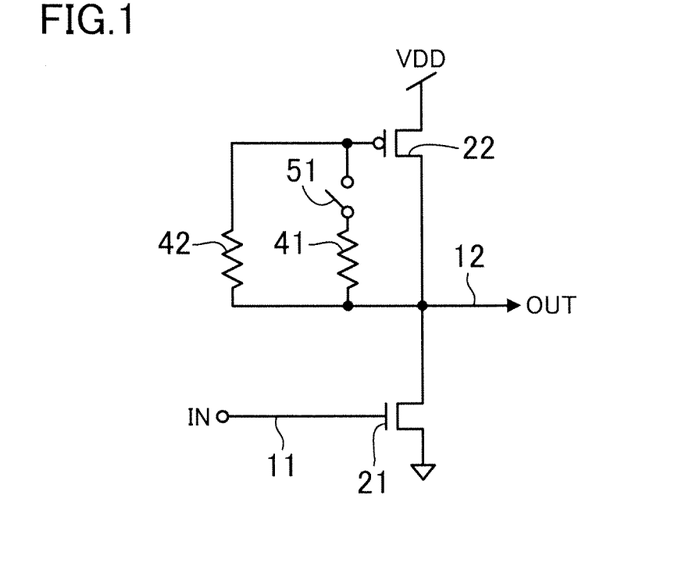
FIG. 1 is a circuit diagram illustrating a configuration of an amplifying circuit according to Embodiment 1 of the present disclosure.

FIG. 1 illustrates a configuration of an amplifying circuit according to Embodiment 1 of the present disclosure. The amplifying circuit of FIG. 1 includes a first transistor 21 configured to convert an input voltage signal 11 supplied through an input terminal IN to a current signal, and an active inductor configured to convert the current signal to an output voltage signal 12 and to supply the output voltage signal 12 to an output terminal OUT. The active inductor includes a second transistor 22 provided between the output terminal OUT and a power supply VDD, a first resistor 41 and a second resistor 42 connected in parallel to each other between a gate and a drain of the second transistor 22, and a switch 51 connected in series to the first resistor 41 between the gate and the drain of the second transistor 22.

Specifically, the first transistor 21 is an NMOS transistor and the second transistor 22 is a PMOS transistor. The first transistor 21 has a gate connected to the input terminal IN, a source connected to a ground, and a drain connected to the output terminal OUT. The second transistor 22 has a source connected to the power supply VDD, and the drain connected to the output terminal OUT. The first resistor 41 and the switch 51 form a series circuit, and this series circuit and the second resistor 42 connected in parallel to the series circuit are connected between the gate and the drain of the second transistor 22.

The amplifying circuit of FIG. 1 can support and amplify different frequency bands because an inductive component of the active inductor can be changed by switching the switch 51 between the on and off states. In addition, the amplifying circuit includes, instead of conventional resistors connected in series to each other, the resistors 41 and 42 connected in parallel to each other, and the number of the resistors to which a voltage is applied can be changed with the switch 51. Consequently, parasitic components added to high-frequency signal lines are reduced, and degradation of the high frequency characteristics can be reduced.

Figure 2:
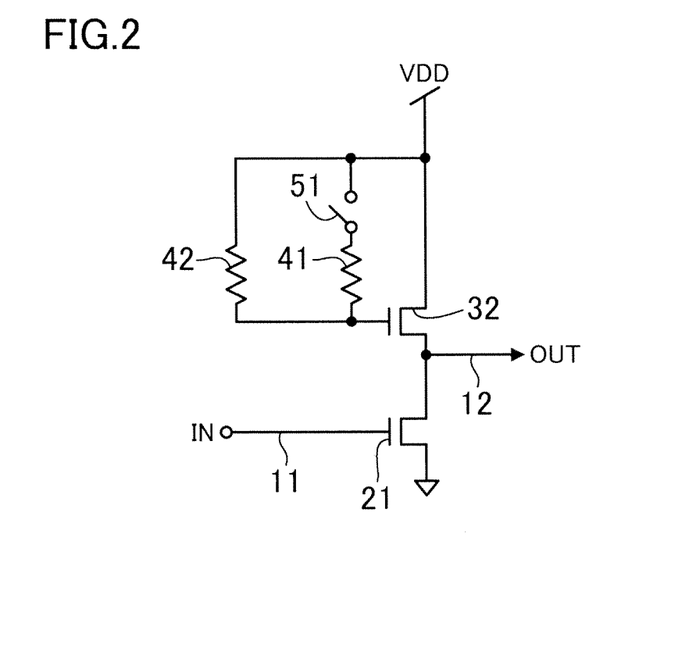
FIG. 2 is a circuit diagram illustrating a configuration of a variation of the amplifying circuit of FIG. 1.

FIG. 2 illustrates a configuration of a variation of the amplifying circuit illustrated in FIG. 1. This variation includes a second transistor 32 which is an NMOS transistor, in place of the second transistor 22 which is the PMOS transistor in FIG. 1. The second transistor 32 has a drain connected to the power supply VDD, and a source connected to the output terminal OUT. The first resistor 41 and the switch 51 form a series circuit, and this series circuit and the second resistor 42 connected in parallel to the series circuit are connected between the gate and the drain of the second transistor 32.

The amplifying circuit of FIG. 2 can also support and amplify different frequency bands because an inductive component of the active inductor can be changed by switching the switch 51 between the on and off states. In addition, the amplifying circuit includes, instead of conventional resistors connected in series to each other, the resistors 41 and 42 connected in parallel to each other, and the number of the resistors to which a voltage is applied can be changed with the switch 51. Consequently, parasitic components added to high frequency lines are reduced, and degradation of the high frequency characteristics can be reduced.

Each of the amplifying circuits of FIGS. 1 and 2 may include another switch connected in series to the second resistor 42.

Embodiment 2

Figure 3:
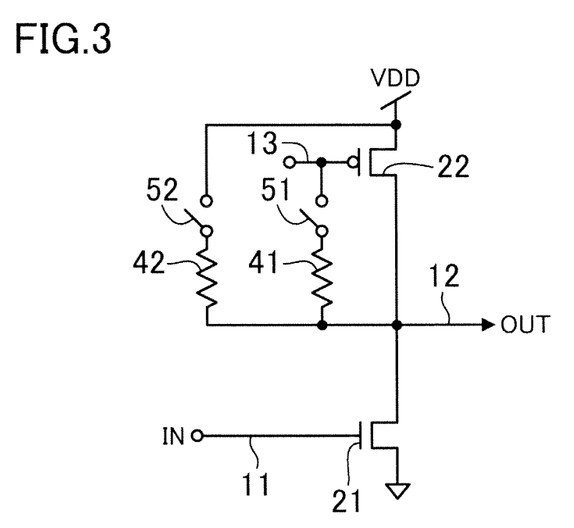
FIG. 3 is a circuit diagram illustrating a configuration of an amplifying circuit according to Embodiment 2 of the present disclosure.

FIG. 3 illustrates a configuration of an amplifying circuit according to Embodiment 2 of the present disclosure. The amplifying circuit of FIG. 3 includes a first transistor 21 configured to convert an input voltage signal 11 supplied through an input terminal IN to a current signal, and an active inductor configured to convert the current signal to an output voltage signal 12 and to supply the output voltage signal 12 to an output terminal OUT. The active inductor includes a second transistor 22 provided between the output terminal OUT and a power supply VDD, and a first resistor 41 and a first switch 51 connected in series to each other between a gate and a drain of the second transistor 22. The amplifying circuit of this embodiment further includes a second resistor 42 and a second switch 52 connected in series to each other between the drain and a source of the second transistor 22.

Specifically, the first transistor 21 is an NMOS transistor and the second transistor 22 is a PMOS transistor. The first transistor 21 has a gate connected to the input terminal IN, a source connected to a ground, and a drain connected to the output terminal OUT. The second transistor 22 has the source connected to the power supply VDD and the drain connected to the output terminal OUT. The first resistor 41 and the first switch 51 form a series circuit, which is connected between the gate and the drain of the second transistor 22, and a control signal 13 is applied to the gate of the second transistor 22. The second resistor 42 and the second switch 52 form another series circuit, which is connected between the drain and the source of the second transistor 22.

When the first switch 51 is in the on state and the second switch 52 is in the off state, the second transistor 22 and the first resistor 41 operate as the active inductor, and the circuit as a whole performs amplification.

On the other hand, when the first switch 51 is in the off state and the second switch 52 is in the on state, since the active inductor including the second transistor 22 does not function, the second resistor 42 converts the current signal to a voltage signal and outputs the voltage signal. Thus, even when a low frequency band is to be amplified and it is hard for the amplifying circuit to function as the active inductor, the amplifying circuit can perform amplification, as a resistance load in a manner similar to ordinary amplifiers.

The amplifying circuit of FIG. 3 can support and amplify different frequency bands because operation by the active inductor can be switched by switching the first and second switches 51 and 52 between the on and off states. In addition, the amplifying circuit includes, instead of conventional resistors connected in series to each other, the series circuit including the first resistor 41 and the first switch 51 and provided between the gate and the drain of the second transistor 22, and the series circuit including the second resistor 42 and the second switch 52 and provided between the drain and the source of the second transistor 22. Consequently, parasitic components added to high-frequency signal lines are reduced, and degradation of the high frequency characteristics can be reduced.

Figure 4:
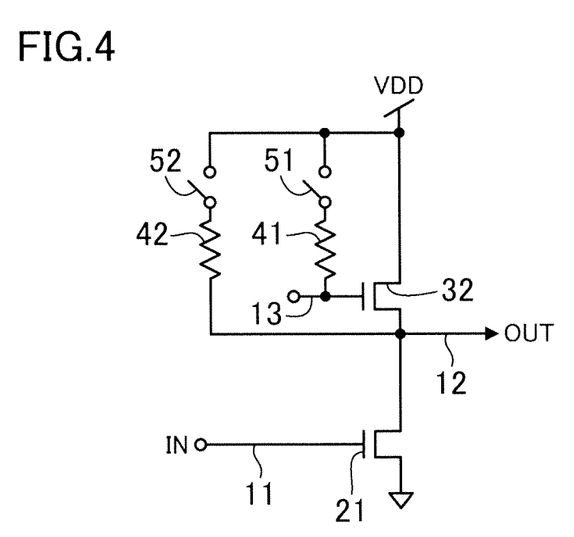
FIG. 4 is a circuit diagram illustrating a configuration of a variation of the amplifying circuit of FIG. 3.

FIG. 4 illustrates a configuration of a variation of the amplifying circuit illustrated in FIG. 3. This variation includes a second transistor 32 which is an NMOS transistor, in place of the second transistor 22 which is the PMOS transistor in FIG. 3. The second transistor 32 has a drain connected to the power supply VDD, and a source connected to the output terminal OUT. The first resistor 41 and the first switch 51 form a series circuit, which is connected between a gate and the drain of the second transistor 32, and a control signal 13 is applied to the gate of the second transistor 32. The second resistor 42 and the second switch 52 form another series circuit, which is connected between the drain and the source of the second transistor 32.

The amplifying circuit of FIG. 4 can also support and amplify different frequency bands because operation by the active inductor can be switched by switching the first and second switches 51 and 52 between the on and off states. In addition, the amplifying circuit includes, instead of conventional resistors connected in series to each other, the series circuit including the first resistor 41 and the first switch 51 and provided between the gate and the drain of the second transistor 32, and the series circuit including the second resistor 42 and the second switch 52 and provided between the drain and the source of the second transistor 32. Consequently, parasitic components added to high-frequency signal lines are reduced, and degradation of the high frequency characteristics can be reduced.

Embodiment 3

Figure 5:
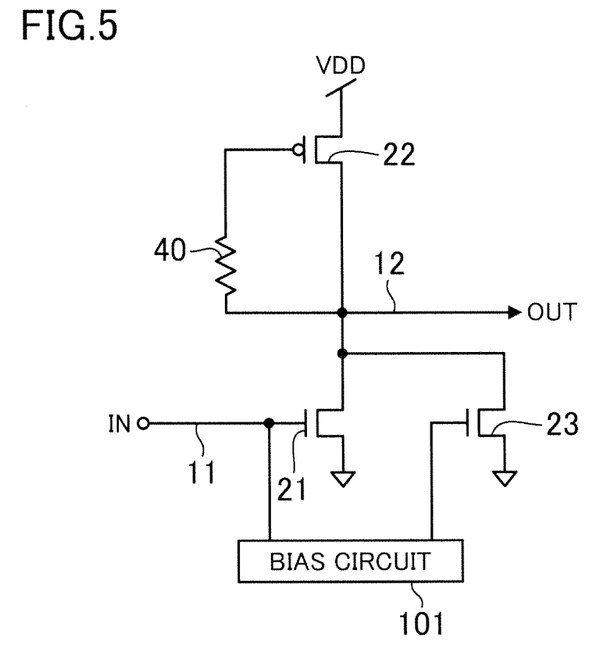
FIG. 5 is a circuit diagram illustrating a configuration of an amplifying circuit according to Embodiment 3 of the present disclosure.

FIG. 5 illustrates a configuration of an amplifying circuit according to Embodiment 3 of the present disclosure. The amplifying circuit of FIG. 5 includes a first transistor 21 configured to convert an input voltage signal 11 supplied through an input terminal IN to a current signal, and an active inductor configured to convert the current signal to an output voltage signal 12 and to supply the output voltage signal 12 to an output terminal OUT. The active inductor includes a second transistor 22 provided between the output terminal OUT and a power supply VDD, and a resistor 40 connected between a gate and a drain of the second transistor 22. The amplifying circuit of this embodiment further includes a third transistor 23 which is configured to draw a current, connected to the output terminal OUT, and in parallel with the first transistor 21, and a bias circuit 101 which is configured to control individually a current flowing through the first transistor 21 and a current flowing through the third transistor 23.

Specifically, the first transistor 21 is an NMOS transistor, the second transistor 22 is a PMOS transistor, and the third transistor 23 is an NMOS transistor. The first transistor 21 has a gate connected to the input terminal IN and the bias circuit 101, a source connected to a ground, and a drain connected to the output terminal OUT. The second transistor 22 has a source connected to the power supply VDD and the drain connected to the output terminal OUT. The resistor 40 is connected between the gate and the drain of the second transistor 22. The third transistor 23 has a gate connected to the bias circuit 101, a source connected to a ground, and a drain connected to the output terminal OUT.

Here, since a gain of the first transistor 21 and an inductive component of the active inductor can be changed by causing the bias circuit 101 to control individually the first transistor 21 and the third transistor 23, the gain of the amplifying circuit can be changed and the amplifying circuit can support and amplify different frequency bands.

That is, according to the embodiment illustrated in FIG. 5, the control by the bias circuit 101 changes the gain of the amplifying circuit and enables the amplifying circuit to support and amplify different frequency bands. In addition, the amplifying circuit includes, instead of conventional resistors connected in series to each other, the third transistor 23 configured to draw a current to flow through the second transistor 22 constituting a main portion of the active inductor, and is configured such that the bias circuit 101 individually controls the first transistor 21 and the third transistor 23. Consequently, parasitic components added to high-frequency signal lines are reduced, and degradation of the high frequency characteristics can be reduced.

Figure 6:
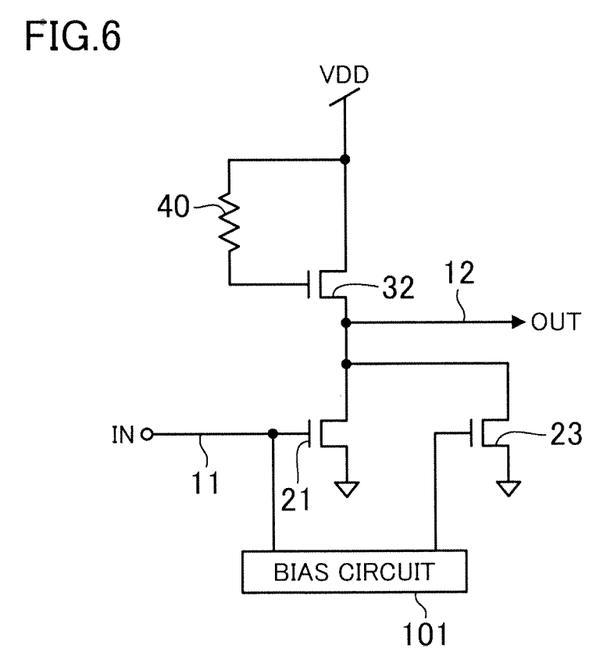
FIG. 6 is a circuit diagram illustrating a configuration of a first variation of the amplifying circuit of FIG. 5.

FIG. 6 illustrates a configuration of a first variation of the amplifying circuit illustrated in FIG. 5. This first variation includes a second transistor 32 which is an NMOS transistor, in place of the second transistor 22 which is the PMOS transistor in FIG. 5. The second transistor 32 has a drain connected to the power supply VDD and a source connected to the output terminal OUT. The resistor 40 is connected between a gate and the drain of the second transistor 32.

According to the variation illustrated in FIG. 6, the control by the bias circuit 101 also changes the gain of the amplifying circuit and enables the amplifying circuit to support and amplify different frequency bands. In addition, the amplifying circuit includes, instead of conventional resistors connected in series to each other, the third transistor 23 configured to draw the current to flow through the second transistor 32 constituting a main portion of the active inductor, and is configured such that the bias circuit 101 individually controls the first transistor 21 and the third transistor 23. Consequently, parasitic components added to high-frequency signal lines are reduced, and degradation of the high frequency characteristics can be reduced.

Figure 7:
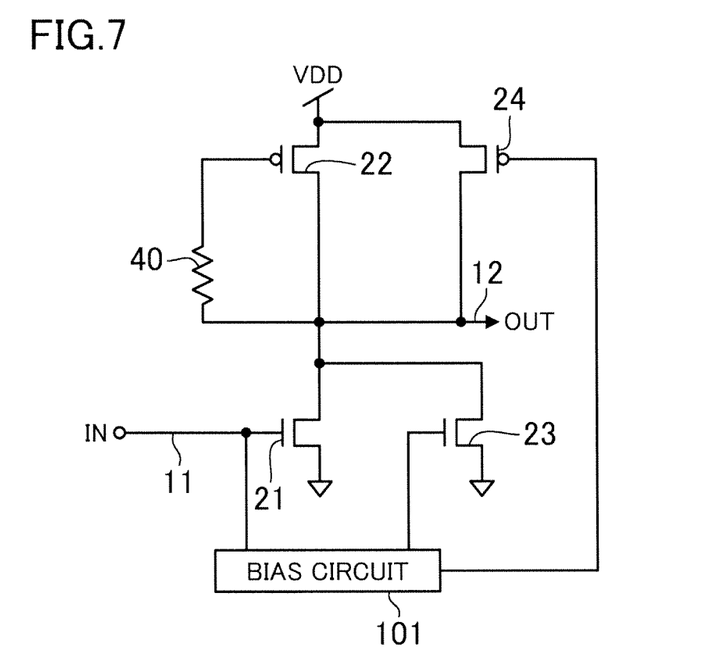
FIG. 7 is a circuit diagram illustrating a configuration of a second variation of the amplifying circuit of FIG. 5.

FIG. 7 illustrates a configuration of a second variation of the amplifying circuit illustrated in FIG. 5. This second variation includes, in addition to the elements illustrated in FIG. 5, a fourth transistor 24 which is a PMOS transistor connected to the output terminal OUT and is in parallel with the second transistor 22. The fourth transistor 24 has a gate connected to the bias circuit 101, a drain connected to the power supply VDD, and a source connected to the output terminal OUT. The bias circuit 101 of this variation individually controls a current flowing through the first transistor 21, a current flowing through the third transistor 23, and a current flowing through the fourth transistor 24.

Here, since a gain of the first transistor 21 and an inductive component of the active inductor can be changed by causing the bias circuit 101 to control individually the first transistor 21, the third transistor 23, and the fourth transistor 24, the gain of the amplifying circuit can be changed and the amplifying circuit can support and amplify different frequency bands.

That is, according to the variation illustrated in FIG. 7, the control by the bias circuit 101 changes the gain of the amplifying circuit and enables the amplifying circuit to support and amplify different frequency bands. In addition, the amplifying circuit includes, instead of conventional resistors connected in series to each other, the third transistor 23 configured to draw the current to flow through the second transistor 22 constituting a main portion of the active inductor, and the fourth transistor 24 configured to divert part of the current to flow through the second transistor 22, and is configured such that the bias circuit 101 individually controls the first transistor 21, the third transistor 23, and the fourth transistor 24. Consequently, parasitic components added to high-frequency signal lines are reduced, and degradation of the high frequency characteristics can be reduced.

Figure 8:
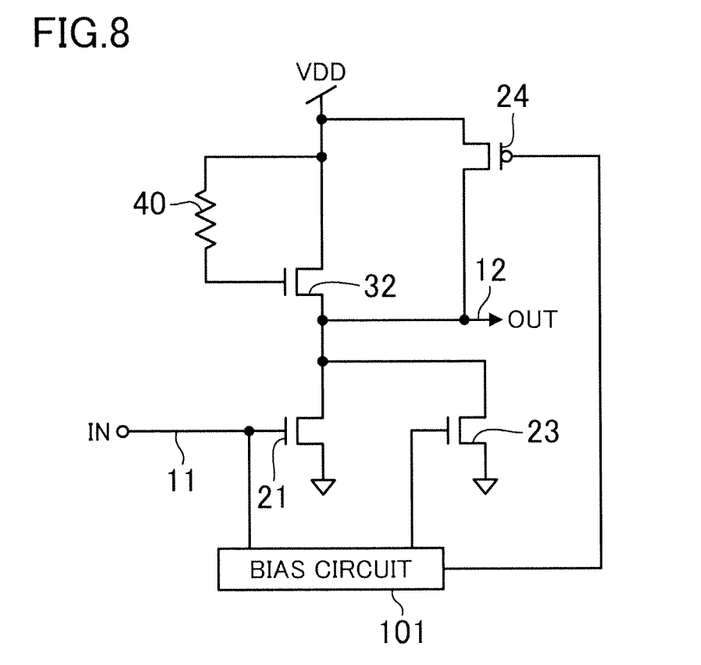
FIG. 8 is a circuit diagram illustrating a configuration of a third variation of the amplifying circuit of FIG. 5.

FIG. 8 illustrates a configuration of a third variation of the amplifying circuit illustrated in FIG. 5. This third variation includes a second transistor 32 which is an NMOS transistor, in place of the second transistor 22 which is the PMOS transistor in FIG. 7. The second transistor 32 has a drain connected to the power supply VDD and a source connected to the output terminal OUT. The resistor 40 is connected between a gate and the drain of the second transistor 32.

According to the variation illustrated in FIG. 8, the control by the bias circuit 101 also changes the gain of the amplifying circuit and enables the amplifying circuit to support and amplify different frequency bands. In addition, the amplifying circuit includes, instead of conventional resistors connected in series to each other, the third transistor 23 configured to draw the current to flow through the second transistor 32 constituting a main portion of the active inductor, and the fourth transistor 24 configured to divert part of the current to flow through the second transistor 32, and is configured such that the bias circuit 101 individually controls the first transistor 21, the third transistor 23, and the fourth transistor 24. Consequently, parasitic components added to high-frequency signal lines are reduced, and degradation of the high frequency characteristics can be reduced.

In the configurations illustrated in FIGS. 5-8, the bias circuit 101 may perform control such that the current flowing through the second transistor 22 or 32 remains unchanged. If this is the case, even when the gain of the first transistor 21 is changed, the current flowing through the second transistor 22 or 32 remains constant. Consequently, an inductive component of the active inductor is maintained constant, thereby enabling the amplifying circuit to support and amplify one frequency band.

Embodiment 4

Figure 9:
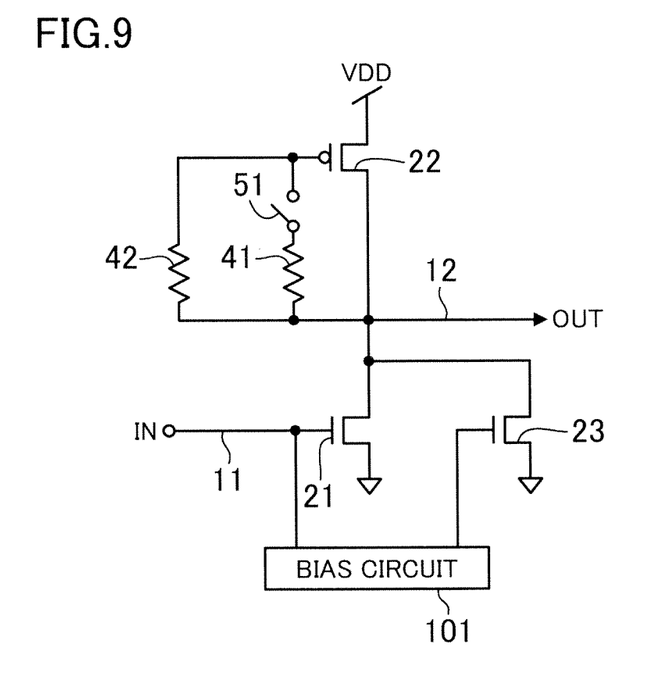
FIG. 9 is a circuit diagram illustrating a configuration of an amplifying circuit according to Embodiment 4 of the present disclosure.

FIG. 9 illustrates a configuration of an amplifying circuit according to Embodiment 4 of the present disclosure. The amplifying circuit of FIG. 9 includes, in addition to the elements illustrated in FIG. 1, a third transistor 23 and a bias circuit 101. The third transistor 23 is an NMOS transistor which is connected to the output terminal OUT and in parallel with the first transistor 21. The third transistor 23 has a gate connected to the bias circuit 101, a source connected to a ground, and a drain connected to the output terminal OUT. The bias circuit 101 is configured to control individually a current flowing through the first transistor 21 and a current flowing through the third transistor 23.

The amplifying circuit of this embodiment can support and amplify different frequency bands because an inductive component of the active inductor can be changed by switching the switch 51 between the on and off states. In addition, since the gain of the first transistor 21 and the inductive component of the active inductor can be changed by causing the bias circuit 101 to control individually the first transistor 21 and the third transistor 23, the gain of the amplifying circuit can be changed and the amplifying circuit can support and amplify different frequency bands.

That is, according to the embodiment illustrated in FIG. 9, the control of the switch 51 and the bias circuit 101 can change the gain of the amplifying circuit and enables the amplifying circuit to support and amplify different frequency bands. In addition, the amplifying circuit includes, instead of conventional resistors connected in series to each other, the resistors 41 and 42 connected in parallel to each other, and the number of the resistors to which a voltage is applied can be changed with the switch 51. Further, the amplifying circuit includes the third transistor 23 configured to draw a current to flow through the second transistor 22 constituting a main portion of the active inductor, and is configured such that the bias circuit 101 individually controls the first transistor 21 and the third transistor 23. Consequently, parasitic components added to high-frequency signal lines are reduced, and degradation of the high frequency characteristics can be reduced.

The amplifying circuits of FIG. 9 may include another switch connected in series to the second resistor 42.

A third transistor 23 and a bias circuit 101 may be added to the configuration of FIG. 2.

The bias circuit 101 may perform control such that the current flowing through the second transistor 22 remains unchanged. If this is the case, even when the gain of the first transistor 21 is changed, the current flowing through the second transistor 22 remains constant. Consequently, an inductive component of the active inductor is maintained constant, thereby enabling the amplifying circuit to support and amplify one frequency band.

Embodiment 5

Figure 10:
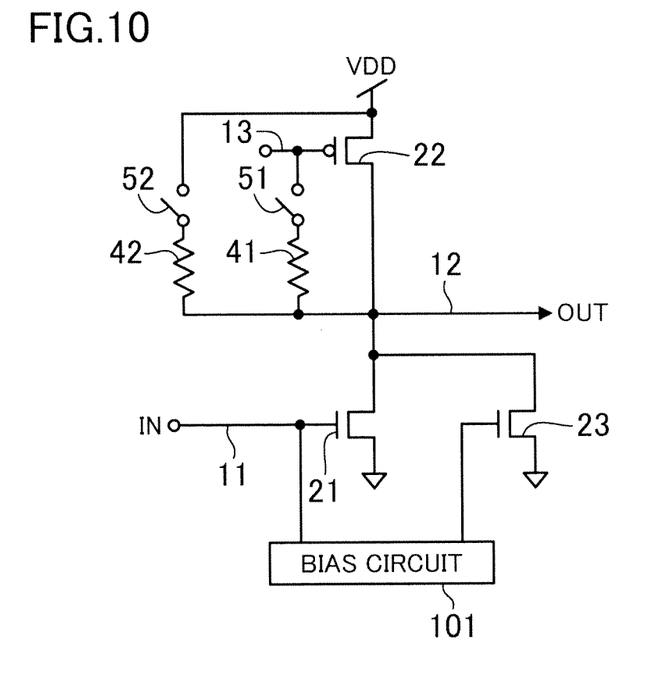
FIG. 10 is a circuit diagram illustrating a configuration of an amplifying circuit according to Embodiment 5 of the present disclosure.

FIG. 10 illustrates a configuration of an amplifying circuit according to Embodiment 5 of the present disclosure. The amplifying circuit of FIG. 10 includes, in addition to the elements illustrated in FIG. 3, a third transistor 23 and a bias circuit 101. The third transistor 23 is an NMOS transistor which is connected to the output terminal OUT and in parallel with the first transistor 21. The third transistor 23 has a gate connected to the bias circuit 101, a source connected to a ground, and a drain connected to the output terminal OUT. The bias circuit 101 is configured to control individually a current flowing through the first transistor 21 and a current flowing through the third transistor 23.

The amplifying circuit of this embodiment can support and amplify different frequency bands because operation by the active inductor can be switched by switching the first and second switches 51 and 52 between the on and off states. In addition, since a gain of the first transistor 21 and an inductive component of the active inductor can be changed by causing the bias circuit 101 to control individually the first transistor 21 and the third transistor 23, the gain of the amplifying circuit can be changed and the amplifying circuit can support and amplify different frequency bands.

That is, according to the embodiment illustrated in FIG. 10, the control of the switches 51, 52 and the bias circuit 101 can change the gain of the amplifying circuit and enables the amplifying circuit to support and amplify different frequency bands. In addition, the amplifying circuit includes, instead of conventional resistors connected in series to each other, a series circuit including the first resistor 41 and the first switch 51 and provided between the gate and the drain of the second transistor 22 and a series circuit including the resistor 42 and the second switch 52 and provided between the drain and the source of the second transistor 22. Further, the amplifying circuit includes the third transistor 23 configured to draw a current to flow through the second transistor 22 constituting a main portion of the active inductor, and is configured such that the bias circuit 101 individually controls the first transistor 21 and the third transistor 23. Consequently, parasitic components added to high-frequency signal lines are reduced, and degradation of the high frequency characteristics can be reduced.

A third transistor 23 and a bias circuit 101 may be added to the configuration of FIG. 4.

The bias circuit 101 may perform control such that the current flowing through the second transistor 22 remains unchanged. If this is the case, even when the gain of the first transistor 21 is changed, the current flowing through the second transistor 22 remains constant. Consequently, an inductive component of the active inductor is maintained constant, thereby enabling the amplifying circuit to support and amplify one frequency band.

Figure 11:
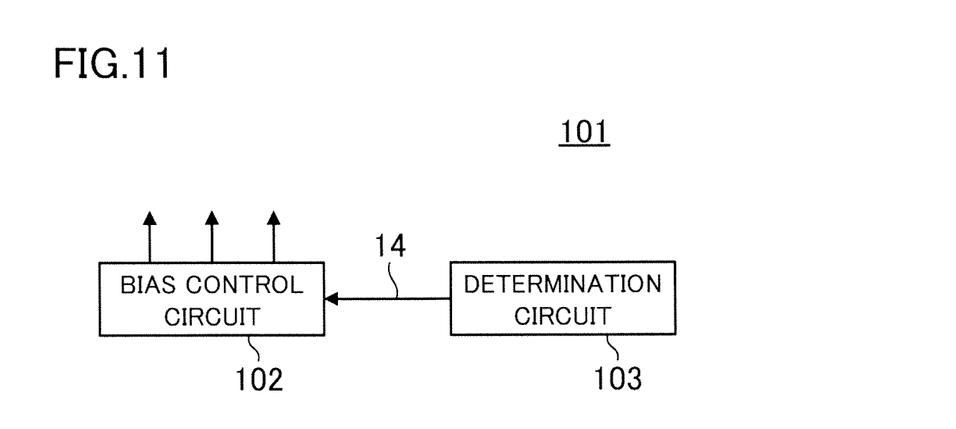
FIG. 11 is a block diagram illustrating in detail a configuration of a bias circuit of FIGS. 5-10.

FIG. 11 illustrates in detail an example of the configuration of the bias circuit 101 of FIGS. 5-10. The bias circuit 101 of FIG. 11 includes a bias control circuit 102 and a determination circuit 103. The bias control circuit 102 is configured to control individually a gate voltage of the first transistor 21 and a gate voltage of the third transistor 23. If the fourth transistor 24 is provided, the bias control circuit 102 further controls a gate voltage of the fourth transistor 24 individually. The determination circuit 103 is configured to carry out determination of the strength of the output voltage signal 12 or determination of the resistance variation in the active inductor, and to control operation by the bias control circuit 102 by means of a control signal 14 corresponding to the results of the determination. It is thus possible to correct the gain and bands to be amplified in accordance with the results of the determination.

The determination of the resistance variation is carried out for the following reasons. The frequency characteristics of the active inductor depend on a resistance value, and diffusion variation may cause variation in the characteristics, which may require a correction. Specifically, resistance variation can be determined by means of an RC oscillator or by fixation with the use of a fuse according to a resultant resistance value.

Note that the conductivity type of the MOS transistors serving as the first to fourth transistors 21-24 is not limited to those exemplified above.

The present disclosure enables amplifying circuits including an active inductor to switch between frequency bands and to control the gain while reducing degradation of the high frequency characteristics. Therefore, the present disclosure is useful particularly for semiconductor integrated circuits which are used particularly in the field related to wireless sensor networks for example and activated with button batteries, and for which reduction of power consumption is desired.

What is claimed is:

1. An amplifying circuit comprising:
a first transistor converting an input voltage signal to a current signal; and
an active inductor converting the current signal to an output voltage signal and supplying the output voltage signal to an output terminal, wherein
the active inductor includes:
a second transistor provided between the output terminal and a power supply,
a first resistor and a second resistor connected in parallel to each other between a gate and a drain of the second transistor, and
a switch connected in series to the first resistor between the gate and the drain of the second transistor.

2. The amplifying circuit of claim 1, further comprising:
a third transistor connected to the output terminal and being in parallel with the first transistor; and
a bias circuit controlling individually a current flowing through the first transistor and a current flowing through the third transistor.

3. A semiconductor integrated circuit comprising the amplifying circuit of claim 1.

4. An amplifying circuit comprising:
a first transistor converting an input voltage signal to a current signal; and
an active inductor converting the current signal to an output voltage signal and supplying the output voltage signal to an output terminal, wherein
the active inductor includes:
a second transistor provided between the output terminal and a power supply, and
a first resistor and a first switch connected in series to each other between a gate and a drain of the second transistor, and
the amplifying circuit further includes a second resistor and a second switch connected in series to each other between the drain and a source of the second transistor.

5. The amplifying circuit of claim 4, further comprising:
a third transistor connected to the output terminal and being in parallel with the first transistor; and
a bias circuit controlling individually a current flowing through the first transistor and a current flowing through the third transistor.

6. The amplifying circuit of claim 5, wherein the bias circuit performs control such that a current flowing through the second transistor remains unchanged.

7. The amplifying circuit of claim 5, wherein
the bias circuit includes:
a bias control circuit controlling individually a gate voltage of the first transistor and a gate voltage of the third transistor, and
a determination circuit carrying out determination of strength of the output voltage signal or determination of resistance variation in the active inductor, and controlling operation by the bias control circuit in accordance with results of the determination.

8. A semiconductor integrated circuit comprising the amplifying circuit of claim 4.

9. An amplifying circuit comprising:
a first transistor converting an input voltage signal to a current signal; and
an active inductor converting the current signal to an output voltage signal and supplying the output voltage signal to an output terminal, wherein
the active inductor includes:
a second transistor provided between the output terminal and a power supply, and
a resistor connected between a gate and a drain of the second transistor, and the amplifying circuit further includes:
a third transistor connected to the output terminal and being in parallel with the first transistor, and
a bias circuit controlling individually a current flowing through the first transistor and a current flowing through the third transistor.

10. The amplifying circuit of claim 9, further comprising:
a fourth transistor connected to the output terminal and being in parallel with the second transistor, wherein
the bias circuit controls individually a current flowing through the first transistor, a current flowing through the third transistor, and a current flowing through the fourth transistor.

11. The amplifying circuit of claim 9, wherein the bias circuit performs control such that a current flowing through the second transistor remains unchanged.

12. The amplifying circuit of claim 9, wherein the bias circuit includes:
- a bias control circuit controlling individually a gate voltage of the first transistor and a gate voltage of the third transistor, and
- a determination circuit carrying out determination of strength of the output voltage signal or determination of resistance variation in the active inductor, and controlling operation by the bias control circuit in accordance with results of the determination.

13. A semiconductor integrated circuit comprising the amplifying circuit of claim 9.

* * * * *